(12) United States Patent
Eggum

(10) Patent No.: US 7,131,176 B2
(45) Date of Patent: Nov. 7, 2006

(54) WAFER SUPPORT ATTACHMENT FOR A SEMI-CONDUCTOR WAFER TRANSPORT CONTAINER

(75) Inventor: Shawn D. Eggum, Lonsdale, MN (US)

(73) Assignee: Entegris, Inc., Chaska, MN (US)

( * ) Notice: Subject to any disclaimer, the term of this patent is extended or adjusted under 35 U.S.C. 154(b) by 0 days.

(21) Appl. No.: 10/979,780

(22) Filed: Nov. 2, 2004

(65) Prior Publication Data

US 2005/0109666 A1    May 26, 2005

Related U.S. Application Data

(63) Continuation of application No. 10/293,210, filed on Nov. 13, 2002, now Pat. No. 6,811,029.

(60) Provisional application No. 60/332,687, filed on Nov. 14, 2001.

(51) Int. Cl.
*B23P 11/00* (2006.01)
*B65D 85/48* (2006.01)

(52) U.S. Cl. ............... 29/436; 29/434; 29/559; 414/935; 211/41.18

(58) Field of Classification Search ............... 29/434, 29/436, 559, 896.93; 206/710, 454, 711, 206/712, 719; 211/41.18; 414/935, 936, 414/937, 938, 939
See application file for complete search history.

(56) References Cited

U.S. PATENT DOCUMENTS

| | | | |
|---|---|---|---|
| 5,452,795 A | 9/1995 | Gallagher et al. | |
| 5,575,394 A * | 11/1996 | Nyseth | 206/710 |
| 5,642,813 A * | 7/1997 | Nyseth | 206/597 |
| 5,788,082 A | 8/1998 | Nyseth | |
| 6,010,008 A | 1/2000 | Nyseth et al. | |
| 6,039,186 A | 3/2000 | Bhatt et al. | |
| 6,216,874 B1 | 4/2001 | Bores et al. | |
| 6,237,979 B1 * | 5/2001 | Korn et al. | 294/159 |
| 6,267,245 B1 | 7/2001 | Bores et al. | |
| 6,273,261 B1 | 8/2001 | Hosoi | |
| 6,398,032 B1 | 6/2002 | Fosnight et al. | |
| 6,520,338 B1 * | 2/2003 | Bores et al. | 206/711 |
| 6,811,029 B1 * | 11/2004 | Eggum | 206/710 |
| 2003/0121870 A1 * | 7/2003 | Beckhart et al. | 211/41.18 |
| 2005/0077204 A1 * | 4/2005 | Sumi et al. | 206/710 |
| 2005/0115866 A1 * | 6/2005 | Burns et al. | 206/710 |

* cited by examiner

*Primary Examiner*—Essama Omgba
(74) *Attorney, Agent, or Firm*—Patterson, Thuente, Skaar & Christensen, P.A.

(57) ABSTRACT

A wafer container for supporting semi-conductor wafer disks and for interfacing with processing equipment and methods for constructing the same. Wafer supports are positioned within an enclosure portion, the wafer supports having a plurality of vertically stacked shelves for defining slots. The wafer supports are secured within the enclosure portion rigidly at the bottom margin and resiliently at the top margin. In preferred embodiments resilient plastic spring members extend between the closed top and the wafer supports to substantially constrain lateral or forward-back movement of the wafer supports with respect to the closed top and to permit some vertical movement of the wafer support with respect to the closed top. The spring members may be configured as a leaf spring integral with an extending from the top margin of each wafer support.

11 Claims, 4 Drawing Sheets

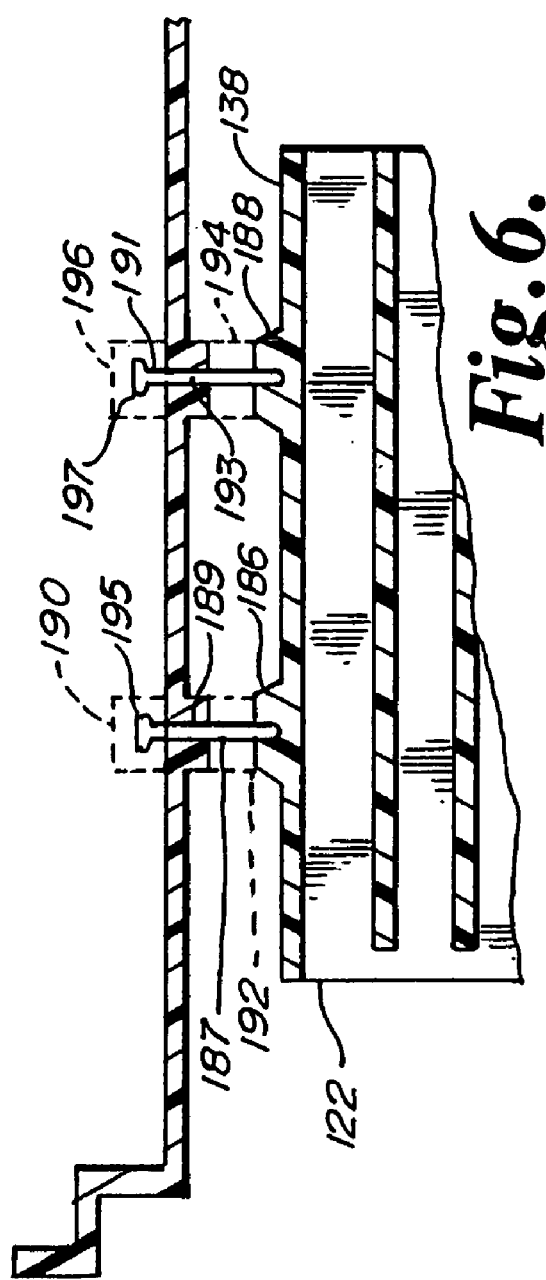
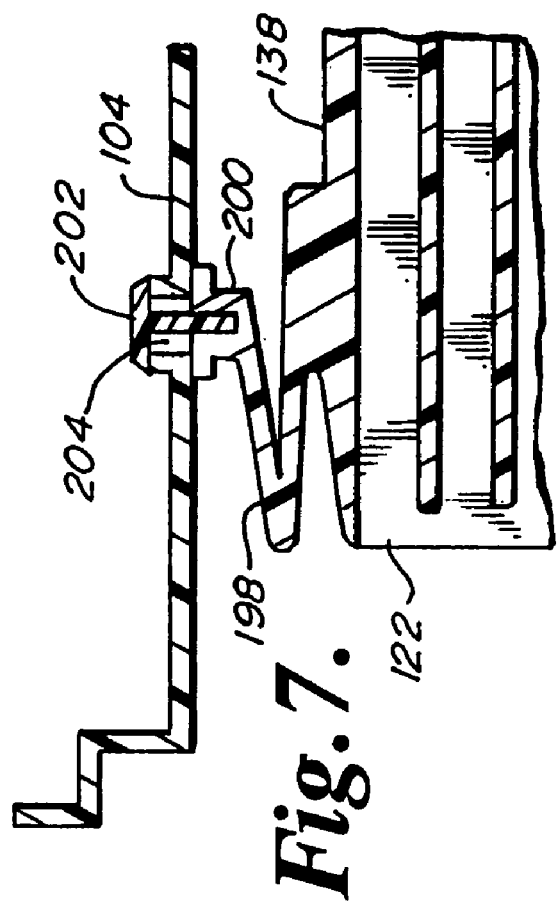

WAFER SUPPORT ATTACHMENT FOR A SEMI-CONDUCTOR WAFER TRANSPORT CONTAINER

This is a continuation of U.S. patent application Ser. No. 10/293,210, filed Nov. 13, 2002 now U.S. Pat. No. 6,811,029, which in turn claims the benefit U.S. Provisional Application No. 60/332,687 filed on Nov. 14, 2001.

FIELD OF THE INVENTION

The present invention generally pertains to a wafer carrier designed for supporting, constraining, storing and precisely positioning semi-conductor wafer disks for use in the production of integrated circuits. More specifically, the present invention pertains to attaching wafer supports within a wafer container enclosure so as to allow for precise positioning of the wafer supports within the enclosure while also isolating the wafer supports from movement and distortion of the wafer container enclosure walls.

BACKGROUND OF THE INVENTION

The transformation of semi-conductor wafer disks into integrated circuit chips often involves many steps where the disks are repeatedly processed, stored and transported. The wafers must be transported from workstation to workstation and from facility to facility. Wafer disks are brittle and are easily damaged by physical shock. Also, build-up and discharge of static charges in the vicinity of semiconductor wafers can be catastrophic. Due to the delicate nature of the wafers and their extreme value, it is vital that they are properly protected throughout these procedures from contaminates, and physical and electrical damage.

Specialized carriers or containers are used for handling, storing, and shipping wafers. Such devices normally hold the wafers in axially aligned arrays with, for example, twenty-five wafers in an array. A principal component of the containers is a means for supporting the wafers during handling to protect against physical damage from shock and vibration. This wafer support means may be provided with a path to ground for static dissipation through a machine interface on the bottom of the container. Such containers and support means are known and disclosed, for example, in U.S. Pat. Nos. 5,788,082; 6,010,008; 6,216,874; and 6,267,245, all owned by the owner of this invention, these patents being fully incorporated herein by reference. Such containers are known in the semiconductor processing industry as front opening unified pods or FOUPS.

While these specialized containers have allowed for more efficient automated handling of wafers with less damage, a significant problem has been in precisely locating the wafer disks within the wafer container so as to allow for accurate automated handling of the disks in a production process. Wafer supports and their attaching devices must be designed with sufficient rigidity to firmly and precisely support and locate the wafers when the container is in use. Since the processing of wafer disks is generally automated, it is essential for the container to precisely align the wafer disks according to the specifications of the processing equipment being used. The tolerances available to the container are generally very tight for proper interaction between the processing equipment and the wafer disks. The wafer carrier manufacturing industry constantly strives to design carriers with improved tolerances for better assurance of accurate carrier-equipment alignment.

Generally, wafer containers include machine interface portions, including a guide plate or kinematic coupling and a robotic lifting flange, for moving and properly orienting the carrier with respect to carrier interface portions provided by the processing equipment. Machine interface portions, particularly the kinematic coupling, are often used as a reference point for specifying the relative location of wafer disks for automated processing. The walls of the container, especially the top of the container which is connected to a robotic lifting flange, are susceptible to flexing and distortion when carrying the weight of the container. This flexing and distortional movement is transmitted to the wafer supports through their attachments. Stress and undesired shifting in the position of the wafer supports in the container is the result, increasing the potential for carrier-equipment tolerance mismatch and physical damage to the wafers.

Typically, wafer supports are rigidly attached to the wafer container. Most commonly, threaded fasteners are inserted through an opening in the container wall and threaded into the wafer supports. A problem, however, results from the fact that a small amount of clearance must be allowed between the wafer support and the container walls in order to allow insertion and positioning of the wafer support during assembly of the container. This problem is exacerbated by the variations in dimension and warping of the container enclosure and wafer support sometimes encountered in the injection molding process. These variations make it difficult to manufacture a wafer support with sufficient precision to fit all individual enclosures with a fixed amount of clearance. Often, it is not possible to completely take up the clearance when fastening the wafer support in place, and as a result, the required accuracy for disk positioning is not achieved.

Another problem is presented by differing thermal expansion coefficients of the wafer container shell and the wafer supports. Typically, a wafer container shell is made from polycarbonate material, which generally has a thermal expansion coefficient of about $68 \times 10^{-6}$ in./in./C°. Wafer supports, however, are often made of PEEK which has a thermal expansion coefficient of about $42 \times 10^{-6}$ in./in./C°, or of carbon fiber filled polycarbonate or carbon fiber filled PEEK, which have a thermal expansion coefficient of about $20 \times 10^{-6}$ in./in./C°. Wafer containers are subjected to washing operations, typically at 70–80 C°. With rigidly attached wafer supports, the much larger thermal expansion coefficient of the shell material with respect to the wafer support material results in stresses in both the wafer supports and the shell. Over time, failure of the components and dimensional creep can result.

Thus, what is needed is a wafer container having wafer supports that provide rigid support and precise positioning of the wafer disks for automated processing. At the same time, the wafer support must be isolated from flexing of portions of the enclosure, and ideally maintain an electrical path to ground. Also, the wafer support should be capable of installation in a container without the need to allow excessive clearance for positioning of the support.

SUMMARY OF THE INVENTION

The present invention includes a wafer container having an enclosure portion with an open front for receiving and holding wafers and a door for closing the open front. The enclosure portion has a closed top, a closed bottom, a pair of opposing closed sidewalls, a closed back, and an open front. A pair of wafer supports is positioned inside the enclosure portion, each wafer support having a top margin and a bottom margin and including a plurality of shelves defining wafer seating positions. Each of the wafer supports is rigidly attached to the closed bottom and resiliently attached to the closed top. The resilient attachment of the wafer supports to the closed top may be made by a resiliently flexible plastic connector extending between the closed top and the top margin of each of the wafer supports. Each of these resiliently flexible plastic connectors may have an extension portion that extends from an attachment point at the closed top to an attachment point at the wafer support, and the extension portion may have a greater horizontal component of length than a vertical component. Each of the resiliently flexible plastic connectors may comprise a flat bar with a width generally greater than the thickness and the length generally greater than the width. The wafer supports may be formed of a conductive plastic. The closed top of the enclosure portion may include a robotic flange formed of a conductive plastic and the wafer supports may be resiliently attached to the closed top at the robotic flange by a conductive resiliently flexible plastic spring member.

The present invention may also include a method of constructing a wafer container including the steps of forming an enclosure portion having at least a top and bottom from polycarbonate plastic, molding a pair of wafer supports, positioning the pair of wafer supports in the enclosure so as to define a plurality of wafer seating positions therebetween, rigidly attaching each of the pair of wafer supports to the bottom of the enclosure, and resiliently attaching each of the pair of wafer supports to the top of the enclosure.

The present invention addresses the problems presented by previous wafer support attachment systems in front opening wafer containers. Such containers comprise an enclosure portion with and open front and interior wafer supports positioned at sides of the container portion. A door closes the open front. In the invention, the top of each wafer support is attached with connectors that are oriented so as to at least partially isolate the wafer supports from container shell flexing or movement. The geometry and material of the connectors are selected so as to allow some flexure of the connector, while maintaining enough stiffness so as to prevent excessive movement of the wafer support when fully loaded with wafers.

When the container is in use, the connectors provide stability between the top of the enclosure portion and the wafer supports in the lateral and forward-rearward directions, yet resiliency with respect to the vertical direction. When load is applied to the top of the container, through the robotic lifting flange for example, the resulting deflection of the container housing is taken up in the wafer support connectors. In addition, when the wafer container is subjected to high temperature washing operations, the majority of any differential thermal expansion between the wafer support and the container shell is taken up by the wafer support connectors. In a preferred embodiment, the connectors are configured as cantilevered leaf springs, are integral with the wafer supports, and attach with fasteners to the top of the enclosure portion.

Accordingly, it is an object and advantage of certain embodiments of the invention to provide a rigidly resilient connection at the top of wafer supports to absorb deflection and stress transmitted by loads imposed on a wafer container.

Another object and advantage of certain embodiments of the invention is to provide a connection at the top of wafer supports to minimize the need for wafer support installation clearance to be designed into a wafer container and wafer support thereby improving the dimensional accuracy and process performance of the wafer container.

Another object and advantage of certain embodiments of the invention is to provide a wafer support that has the desirable characteristics of physical compatibility with semi-conductor wafer materials and processing methods.

Another object and advantage of certain embodiments of the invention is to provide a wafer support that has the desirable characteristic of maintaining an electrical path to ground to dissipate static charges.

Another object and advantage of certain embodiments of the invention is to provide a method for wafer container assembly that does not require that installation clearance be pre-designed into an enclosure or wafer supports to allow for positioning of wafer supports.

In a preferred embodiment of the invention, the connectors are molded in one piece with the wafer support. Generally, the material used for the connector will be the same material used for the wafer support itself in order to maintain the desirable characteristics allowed by that material, such as electrical conductivity and physical compatibility with the wafer disk material. Polyetheretherketone (PEEK), particularly with carbon fiber fill, has the desirable characteristics of electrical conductivity and physical compatibility and is the currently preferred material. In a preferred embodiment, two connectors are used to connect each wafer support with the enclosure at the top margin or edge of the wafer support. A rigid method of attachment is used at the opposing margin of the wafer support. The rigid attachment is used at this margin so that a machine interface attached to the bottom of the container can be used as a reference datum to precisely locate the wafer disks during processing. To minimize the effects of tolerance stacking and improve electrical conductivity, portions of the bottom margin of the wafer support preferably extend through apertures in the enclosure bottom and are directly fastened to the kinematic coupling.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

DESCRIPTION OF THE DRAWINGS

FIG. 6 is a partial cross-sectional view showing an alternative embodiment of the invention.

FIG. 7 is a partial cross-sectional view showing another alternative embodiment of the invention.

DETAILED DESCRIPTION OF THE INVENTION

The accompanying Figures depict embodiments of the wafer container of the present invention, and features and components thereof. Any references to front and back, right and left, top and bottom, upper and lower, and horizontal and vertical are intended for convenience of description, not to limit the present invention or its components to any one positional or spacial orientation. Any dimensions specified in the attached Figures and this specification may vary with a potential design and the intended use of an embodiment of the invention without departing from the scope of the invention. In addition, those of skill in the art will recognize that although various fastening methods are shown in the illustrated embodiments, any suitable fastening device or method may be substituted for the illustrated device or method, including any type of fastener, ultrasonic or other welding, staking or molding, without departing from the scope of the invention.

Figure 1:
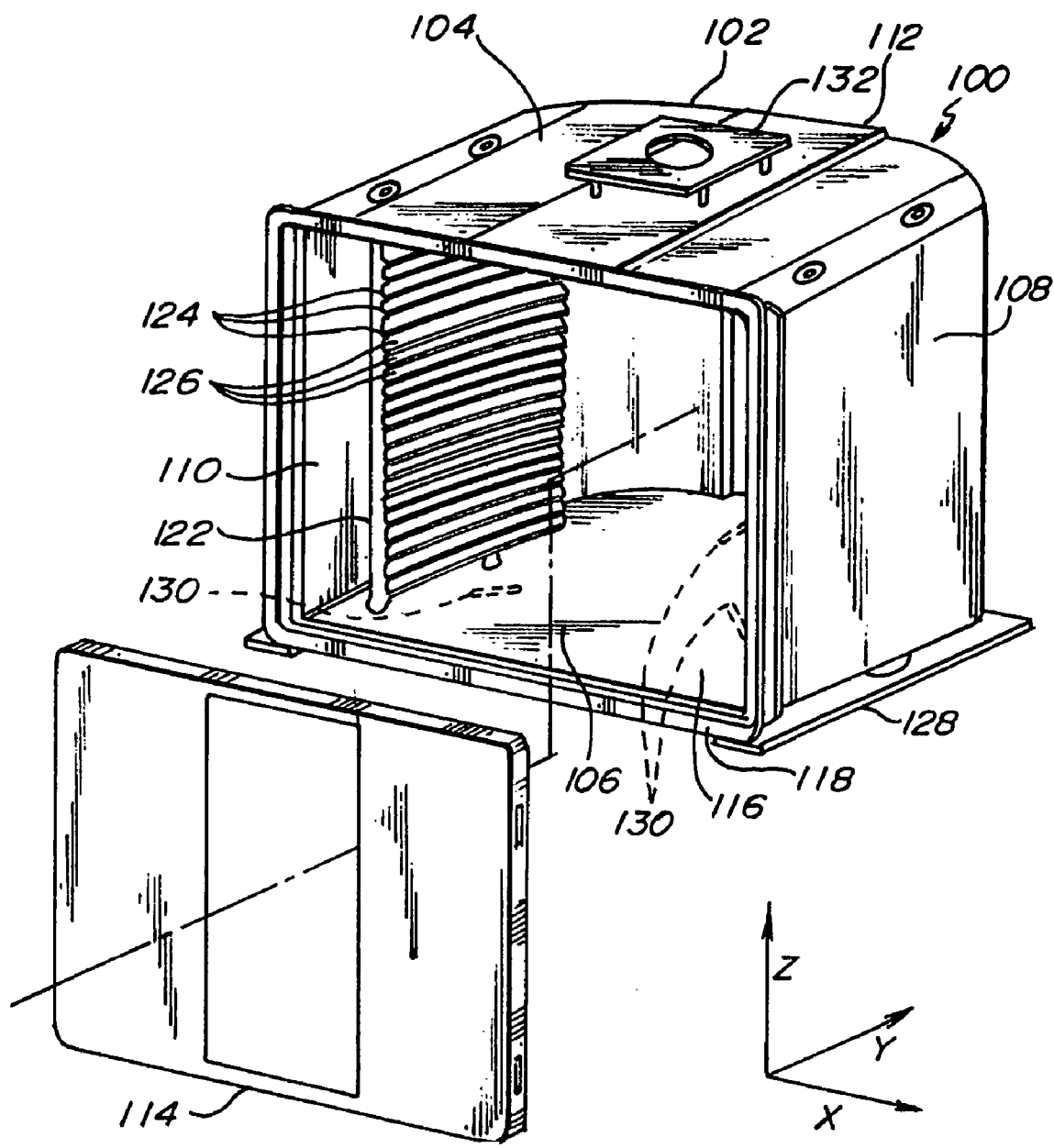
FIG. 1 is a perspective view of a typical semi-conductor wafer transport container.
Figure 2:
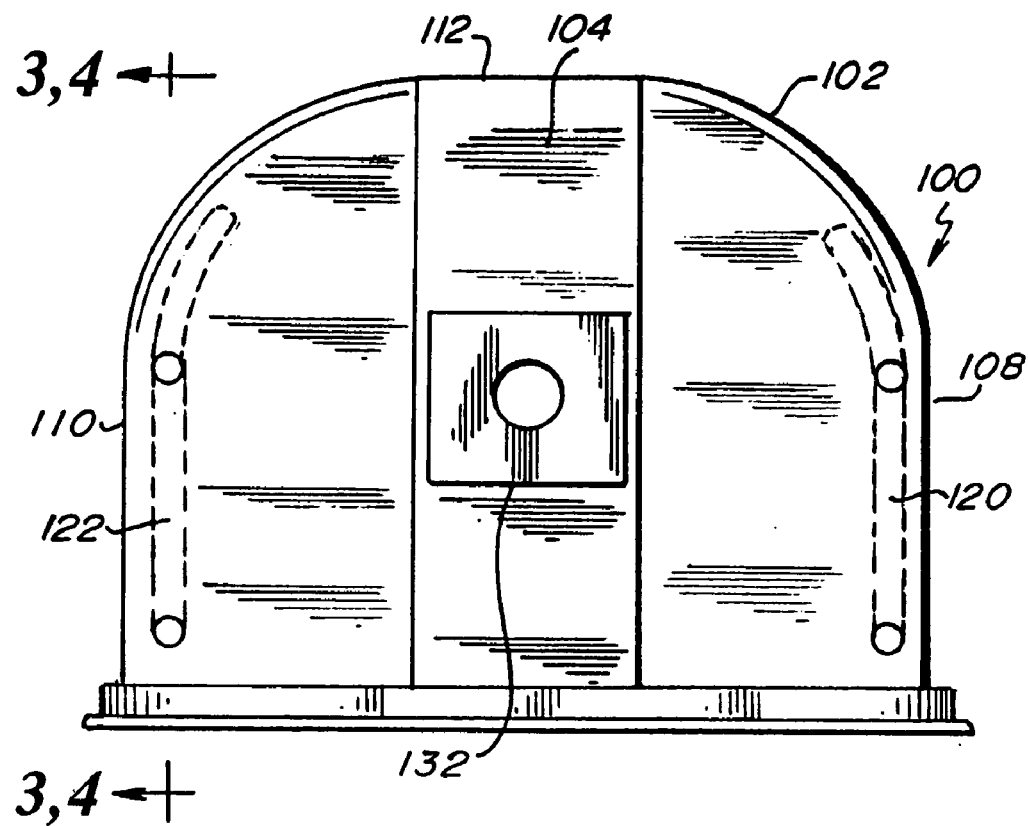
FIG. 2 is a top plan view of the wafer container showing the wafer supports disposed in the container.

FIG. 1 generally depicts a wafer container 100. Wafer container 100 has an enclosure portion 102, constructed of polycarbonate plastic. Enclosure portion 102 generally includes a closed top 104, a closed bottom 106, a pair of opposing closed sides 108, 110, and a closed back 112. A door 114 completes the enclosure by enclosing the open front 116 of enclosure portion 102. Door 114 fits into door recess 118. A pair of wafer supports 120 (not shown) and 122 are provided in enclosure 102 to support semi-conductor wafers. Each wafer support 120, 122 has a plurality of ribs 124, forming recesses 126, thereby defining slots or shelves for supporting the wafer disks when container 100 is in use. Each shelf defines a wafer seating position for a wafer.

Kinematic coupling 128, mounted to the exterior surface of enclosure bottom 106 is provided to facilitate automated handling of the container during use and to provide a reference datum for locating the wafers in the housing during processing. Kinematic coupling 128 has three grooves 130 on the underside thereof, depicted in phantom in FIG. 1. Each groove 130 receives a corresponding upwardly projecting post (not shown) of a piece of processing equipment, thereby enabling container 100 to be accurately and securely positioned on the processing equipment. Further, kinematic coupling 128 may be formed from electrically conducting material, such as conductive plastic, to form a part of an electrical path-to-ground from the wafer supports. An example of a kinematic coupling is described and depicted in more detail in U.S. Pat. No. 6,216,874, previously incorporated herein by reference.

Robotic lifting flange 132 is provided on the exterior surface of enclosure top 104 and is provided to facilitate automated handling and transport of container 100 during use. Robotic flange 132 may be formed from conductive plastic and may be electrically conductively connected with each wafer support 120, 122.

FIG. 1 also designates, for reference purposes, the relative directions of x-y-z coordinates as applied to the wafer container. Any reference herein to movement or distortion in an x-axis direction, a y-axis direction, or a z-axis direction, or to rotation about an x-axis, a y-axis or a z-axis, relates to these coordinate axes. The y-axis is oriented fore-and-aft in the container in the direction of insertion and removal of wafers from the container, the z-axis is vertical and the x-axis is perpendicular to the z-axis and the y-axis, and is oriented laterally from side-to-side of the container.

Figure 3:
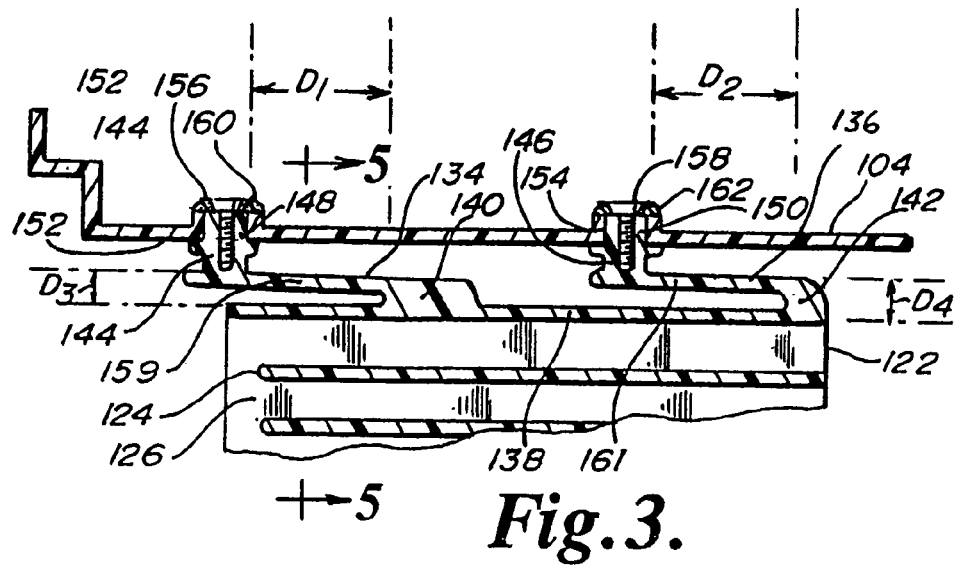
FIG. 3 is a cross-sectional view showing the attachment of a wafer support at the enclosure top in a preferred embodiment of the invention.

Referring to FIGS. 2–5, opposed wafer supports 120, 122 are depicted as they are disposed within enclosure 102. FIG. 3 is a partial cross-sectional view at section 3—3 of wafer container 100 and taken through wafer support 122. Resiliently flexible plastic connectors 134, 136 are molded into the top margin 138 of wafer support 122, and attach to the wafer supports at fulcrums 140, 142. Top fastening bosses 144, 146 are disposed at the ends of connectors 134, 136, and are attachment points for the connectors to fasten to the top 104 of enclosure portion 102. Each of fastening bosses 144, 146 has a portion 148, 150, extending through apertures 152, 154 in enclosure top 104. Fasteners 156, 158, each having washers 160, 162, extend into fastening bosses 144, 146, and secure wafer support 122 to enclosure top 104. Each connector 134, 136, has an extension portion 159, 161, connecting the attachment points at fastening bosses 144, 146, and the attachment points at respective fulcrums 140, 142. Thus, each of extension portions 159, 161, is configured as an elongate leaf spring. The horizontal length of the extension portions designated on FIG. 3 as D1 and D2 respectively, is preferably greater than the vertical length dimensions, designated as D3 and D4 respectively. Fulcrums 140, 142, are spaced apart along top margin 138 of wafer support 122 to provide resistance to rotation of wafer support 122 about the z-axis, as well as resistance to lateral movement, which may also be described as movement oriented along the x—x axis.

Opposing wafer support 120 is attached to container top 104 in identical fashion. In addition, one or more of connectors 134, 136, on each wafer support 120, 122, may be electrically conductively connected with robotic flange 132 to provide electrical grounding for the supports and the wafers supported therein.

Figure 4:
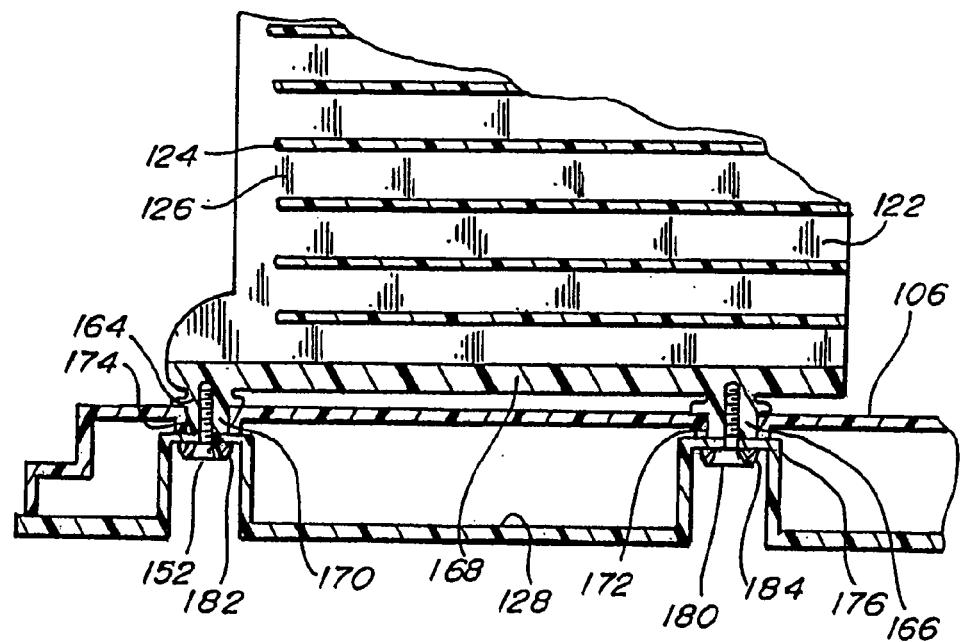
FIG. 4 is a cross-sectional view of the attachment of the wafer support to the enclosure bottom in one embodiment of the invention.

FIG. 4 is a partial cross-sectional view through section 4—4 of the attachment of wafer support 122 at the enclosure bottom 106. Wafer support 122 has fastening bosses 164, 166, which may be molded into bottom margin 168 of wafer support 122. Each fastening boss 164, 166 has a portion 170, 172 extending through apertures 174, 176, in enclosure bottom 106. Each fastening boss 164, 166 thereby directly contacts kinematic coupling 128. Fasteners 178, 180, with washers 182, 184, extend into fastening bosses 164, 166, thereby securing wafer support 122 to enclosure bottom 106 and kinematic coupling 124. The direct contact between fastening bosses 164, 166, and kinematic coupling 124 minimizes tolerance stacking at the connection, and may also provide electrical conductivity for the connection.

Figure 5:
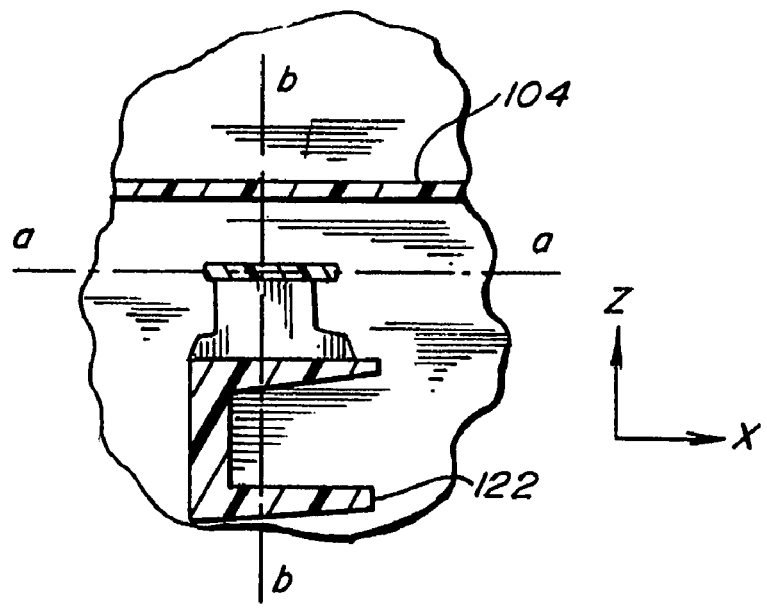
FIG. 5 is a transverse cross-sectional view of a wafer support connector.

FIG. 5 is a transverse cross-section through section 5—5 of top wafer support connector 134. Notably, connector 134 has a much higher moment of inertia about the "b—b " axis as compared to the "a—a " axis. Thus, each connector is a flat bar with a width generally greater than the thickness and the length generally greater than the width.

Consequently, connector 134 is relatively stiff in resisting lateral, side-to-side movement of wafer support 122 in the x-axis direction, but is relatively flexible in allowing vertical movement of enclosure top 104 relative to wafer support 122 in the z-axis direction. Thus, wafer support 122 is resiliently isolated in the vertical z-axis direction from movement and distortion of container top 104, and from z-axis distortion in container back 112 and container sides 108 and 110. At the same time, the rigid connection of each wafer support to container bottom 106 enables precise positioning of the supports and prevents movement relative to the bottom, sides, back and front of the container. As previously mentioned, the stiffness relative to movement in the lateral x-axis direction also provides resistance to rotational movement of the wafer support about the z-axis.

Thus, the wafer support configuration depicted isolates movement and distortion of enclosure top 104 from wafer supports 120, 122, while also rigidly constraining the wafer supports from lateral and rotational movement as described. Those of skill in the art will recognize that an alternative embodiment of the invention, wherein fastening bosses 144, 146 are turned 90 degrees relative to connectors 134, 136 so as to attach to side 110 of the container, will also achieve the desired simultaneous isolation from top 104 and rigid lateral and rotational constraint as described.

Referring now to FIGS. 1–5, the operation of the invention can be understood. Wafer supports 120 and 122 must be precisely positioned inside enclosure portion 102 relative to each of the three axes, x, y and z, in order to allow for accurate location of the wafers by automated wafer processing machines. In other words, the wafer supports and wafers supported therein must be precisely located, laterally, vertically and in the fore-and-aft direction within the container. Each wafer support 120 and 122 is rigidly restrained at its bottom margin 168 from movement in each of the three axes by the rigid connection depicted in FIG. 4. The top of each wafer support 120 and 122 is rigidly restrained from lateral movement in the x-axis direction, as well as rotation about the z-axis, by the leaf spring connectors 134, 136 as depicted in FIG. 3. The relatively lower rigidity of the leaf spring connectors for vertically imposed loads in the z-axis direction, however, allows for movement or distortion of enclosure top 104, relative to wafer supports 120 and 122. Such distortion may occur due to mechanical loading or thermal expansion. Such movement or distortion, and associated stresses, is absorbed in the leaf spring connectors 134, 136, so that it is not transmitted to wafer supports 120 and 122. The resilience of these connections in the vertical z-axis direction thus allows for greater accuracy of positioning of wafer supports 120 and 122 in use, and in less stress occurring in wafer supports 120 and 122, and in enclosure 102.

The invention may also generally include a method of constructing a wafer container. Each wafer support 122 is positioned inside enclosure portion 102. Bottom fastening bosses 164, 166 are inserted through apertures 174, 176, provided in enclosure bottom 106, and are then fastened in place. Top fastening bosses 144, 146, are pressed toward wafer supports 122, bending connectors 134, 136. When fastening bosses 144, 146, are aligned with apertures 152, 154 in enclosure top 104, the resilience of each connector extends the fastening bosses through the aperture. The fastening bosses are then fastened in place, securing the wafer support within the enclosure. An identical procedure is then followed for wafer support 120.

In the preferred embodiment as depicted in FIGS. 1–5, connectors 134, 136, are resiliently flexible plastic connectors. In one embodiment, the connectors are from 1 to 2 millimeters in thickness, 10–15 millimeters in width and from 35 to 55 millimeters in cantilever length. A preferred material for the connectors and wafer supports is carbon fiber filled PEEK. Of course, many other embodiments of the invention are possible, including a variety of different materials, dimensional configurations, and attachment methods.

For instance, FIG. 6 depicts an alternative embodiment of the invention wherein one or more resilient members are used at each top attachment for the wafer supports. In this embodiment, wafer support 122 has fastening bosses 186, 188, formed in top margin 138. Fastener 187 is slidingly disposed in aperture 189 in top 104 and extends into fastening boss 186. Similarly, fastener 191 is slidingly disposed in aperture 193 and extends into fastening boss 188. Resilient member 190 is engaged with head 195 of fastener 187. Resilient member 196 is similarly engaged with head 197 of fastener 191. Resilient members 190, 196, are disposed between top 104 and each fastener head 195, 197, so that upward movement of top 104 compresses resilient members 190, 196, thereby greatly minimizing the amount of upwardly directed force transmitted to fasteners 187 and 191, as well as to wafer support 122 to which the fasteners are connected.

In another embodiment, resilient members 192, 194, may be placed between the underside of top 104 and fastening bosses 186, 188. When positioned as depicted, resilient members 192 may function cooperatively with resilient members 190, 196 to absorb any downward forces exerted on top 104 while providing further lateral stability to wafer support 122. Moreover, in yet another similar embodiment, resilient members 192, 194, may be used without resilient members 190, 196.

Resilient members 190, 192, 194, and 196 may be a resiliently flexible plastic connector structure or any structure with suitably resilient properties. In one embodiment, these resilient members may be solidly formed from elastomeric material. As an alternative, a resilient mechanism or machine component, such as a coil spring, may be used.

Another alternative embodiment is depicted in FIG. 7. In this embodiment, a resilient mechanism 198 is formed in top margin 138 of wafer support 122. Resilient mechanism 198 has a fastening boss 200 for receiving a fastener 202. Fastener 202 extends through aperture 204 in top 104, and secures wafer support 122 to top 104 as before. Any vertical deflection of top 104 is taken up in resilient mechanism 198 and is not transmitted to wafer support 122. Of course, resilient mechanism 198 may be any suitable resiliently flexible plastic connector, or may be any other suitably resilient mechanism such as a coil spring or a solid elastomeric member.

Although the description above contains many specificities, these should not be construed as limiting the scope of the invention but as merely providing illustrations of some of the presently preferred embodiments of the invention. Thus, the scope of the invention is determined by the appended claims and their legal equivalents, rather than by the examples given.

What is claimed is:

1. A method of constructing a wafer container comprising the steps of:
    forming an enclosure portion from polycarbonate plastic, said enclosure portion having at least a top and a bottom;
    molding a pair of wafer supports;
    positioning the pair of wafer supports in the enclosure so as to define a plurality of wafer seating positions therebetween;
    rigidly attaching each of the pair of wafer supports to the bottom of the enclosure; and
    resiliently attaching each of the pair of wafer supports to the top of the enclosure with at least one leaf spring.

2. The method of constructing a wafer container of claim 1, further comprising the step of integrally forming the leaf springs with the top of each wafer support.

3. The method of constructing a wafer container of claim 1, further comprising the step of providing a kinematic coupling by which the pair of wafer supports are rigidly attached to the bottom of the enclosure.

4. The method of constructing a wafer container of claim 3, further comprising the step of forming the kinematic coupling from an electrically conductive material.

5. The method of constructing a wafer container of claim 1, further comprising the step of forming each of said wafer supports from an electrically conductive material.

6. The method of constructing a wafer container of claim 1, further comprising the step of forming the leaf springs from an electrically conductive material.

7. The method of constructing a wafer container of claim 1, further comprising the step of providing a plurality of fastening bosses by which the pair of wafer supports are rigidly attached to the bottom of the enclosure.

8. A method of constructing a wafer container comprising the steps of:

forming an enclosure portion from polycarbonate plastic, said enclosure portion having at
least a top and a bottom;
molding a pair of wafer supports;
positioning the pair of wafer supports in the enclosure so as to define a plurality of wafer seating positions therebetween;
rigidly attaching each of the pair of wafer supports to the bottom of the enclosure;
providing a robotic flange formed of conductive plastic to the top of the enclosure portion by which the wafer supports are resiliently attached to the top of the enclosure; and
resiliently attaching the wafer supports to the robotic flange with a conductive resiliently flexible plastic spring member.

9. A method of constructing a wafer container comprising the steps of:

forming an enclosure portion from plastic, said enclosure portion having at least a top and a bottom;
molding a pair of wafer supports, each wafer support having a bottom margin and a top margin;
resiliently operably coupling each top margin to the top of the enclosure portion with a spring portion; and
rigidly fixing each bottom margin to the bottom of the enclosure portion;
whereby each wafer support is rigidly restrained from movement in a lateral direction, a fore and aft direction, and a vertical direction relative to the enclosure portion, and whereby each wafer support is resiliently isolated from distortion and relative vertical movement of said top of said enclosure portion.

10. The method of constructing a wafer container of claim 9 further comprising the step of directly securing each wafer support to a kinematic coupling disposed on said bottom of said enclosure portion.

11. The method of constructing a wafer container of claim 10, further comprising the step of forming each of said wafer supports, the kinematic coupling, and each of said spring portions from an electrically conductive material.

* * * * *